United States Patent
Kitani

(10) Patent No.: US 11,513,880 B1
(45) Date of Patent: Nov. 29, 2022

(54) FAILURE BIT COUNT CIRCUIT FOR MEMORY AND METHOD THEREOF

(71) Applicant: Powerchip Semiconductor Manufacturing Corporation, Hsinchu (TW)

(72) Inventor: Tomofumi Kitani, Tokyo (JP)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 17/412,289

(22) Filed: Aug. 26, 2021

(51) Int. Cl.
*G06F 11/07* (2006.01)
*G11C 16/34* (2006.01)

(52) U.S. Cl.
CPC ........ *G06F 11/076* (2013.01); *G06F 11/0727* (2013.01); *G11C 16/3459* (2013.01)

(58) Field of Classification Search
CPC . G06F 11/076; G06F 11/0727; G11C 16/3459
USPC .......................................................... 714/819
See application file for complete search history.

(56) References Cited

U.S. PATENT DOCUMENTS

| | | | |
|---|---|---|---|
| 10,714,197 B1 | 7/2020 | Lee et al. | |
| 10,720,932 B1 | 7/2020 | Kitani | |
| 10,923,192 B2 | 2/2021 | Kim | |
| 2005/0018497 A1* | 1/2005 | Frankowsky | G11C 29/72 365/200 |
| 2006/0143550 A1* | 6/2006 | Liu | G01R 31/2831 714/725 |
| 2011/0051514 A1* | 3/2011 | Han | G11C 16/3459 365/185.09 |
| 2011/0264989 A1* | 10/2011 | Resch | G06F 11/076 714/E11.034 |
| 2013/0212452 A1* | 8/2013 | Kern | G05B 9/03 714/E11.024 |

(Continued)

FOREIGN PATENT DOCUMENTS

| CN | 105720560 A | * 6/2016 |
|---|---|---|
| CN | 110556152 | 12/2019 |

(Continued)

OTHER PUBLICATIONS

"Notice of allowance of Taiwan Counterpart Application", dated May 6, 2022, p. 1-p. 4.

*Primary Examiner* — Albert Decady
*Assistant Examiner* — Enam Ahmed
(74) *Attorney, Agent, or Firm* — JCIPRNET

(57) ABSTRACT

A failure bit count (FBC) circuit for memory array is provided. The memory array includes pages each having plural sectors and a redundancy column. The FBC circuit includes FBC units, in which each FBC unit is respectively coupled to each sector for providing a failure bit count current; a redundancy FBC unit coupled to the redundancy column and provides a redundancy current; a switch having a first end and a second end capable of being switched to couple to one of outputs of the FBC units to receive the failure bit count current from one of the FBC units; a comparator having a first input end that receives a reference current, and a second input end that receives a measurement current obtained by adding the failure measurement current and the redundancy current, and an output end outputting a judge signal to indicate a number of failure bits for each sector.

15 Claims, 5 Drawing Sheets

(56) References Cited

U.S. PATENT DOCUMENTS

2017/0139761 A1\* 5/2017 Song ........................ G06F 12/02
2018/0232267 A1     8/2018 Koo et al.
2021/0182166 A1\* 6/2021 Hahn ................... G06F 11/3034

FOREIGN PATENT DOCUMENTS

| CN | 110556152 A | \* | 12/2019 | ......... G11C 11/5628 |
| --- | --- | --- | --- | --- |
| CN | 111599400 | | 8/2020 | |
| KR | 101527690 B1 | \* | 6/2015 | ............. G11C 29/48 |
| TW | I299494 | | 8/2008 | |
| TW | I725799 | | 4/2021 | |

\* cited by examiner

FAILURE BIT COUNT CIRCUIT FOR MEMORY AND METHOD THEREOF

BACKGROUND

Technical Field

The disclosure relates to a failure bit count circuit for memory and method thereof.

Description of Related Art

Memory devices, such as flash memory devices, require a function of failure bit count (FBC) on program verify operation because the memory devices allow n bit failure in a sector. In order to correct those failure bits, the memory device requires an engine of error correction code (ECC).

FIG. 1 illustrates a configuration for repairing the memory cells and failure bit count mechanism in the memory device. As shown in FIG. 1, one page 10 of a memory device may include multiple regular areas 12, such as sector-1, sector-2, sector-3 and sector-4, and a redundancy area 14. The structure of the redundancy area 14 is basically the same as the regular areas 12. When the failure bit number is larger than the allowable failure bit number in any one of the regular areas 12, the redundancy area 14 is used to replay the regular area so as to repair the memory.

In addition, FIG. 2 illustrates a failure bit count circuit for a memory device. A failure bit count unit FBC-1 of the failure bit count circuit is provided in a page buffer, and no information of column redundancy address is provided. Therefore, in the related art, the possible way to obtain the number of failure bit is to calculate every page instead of every sector. Finally, the failure bit count unit FBC-1 outputs the failure bit count current $I_{SEC1}$ which increase with the number n of failure bits. The failure bit count current $I_{SEC1}$ is compared with a reference current $I_{REF}$ by the comparator CMP1 to output the judge signal JUDGE[n].

By the failure bit count unit FBC-1, when the program verify is failed (the dashed line provides low level L) and the node L1S keeps at the low level L, the NMOS transistors N2, N2 are turned on. As the number of failure bits is n, the failure bit count current $I_{SEC1}$ becomes the value equal to the failure bit current $I_{FB}$ multiplied by n. In addition, the reference current generator (current mirror) including NMOS transistors N11, N12 provides the reference current $I_{REF}$ to the comparator CMP1. Therefore, the comparator CMP1 can output the judge signal JUDGE[n] to indicate the number n of failure bits.

However, in the above configuration, the failure bit counting can be performed only for each page. Therefore, it is necessary to provide a failure bit count circuit that can perform failure bit counting for each sector.

SUMMARY

According to one embodiment of the disclosure, a failure bit count circuit for memory array is provided, in which the memory array comprises a plurality of pages and each of the pages comprises a plurality of sectors and a redundancy column. The failure bit count circuit for each of the pages comprises a plurality of failure bit count units, in which each of the plurality of failure bit count units is respectively coupled to each of the plurality of sectors for providing a failure bit count current; a redundancy failure bit count unit which is coupled to redundancy column and provides a redundancy current; a switch which has a first end and a second end that is capable of being switched to couple to one of outputs of the plurality of failure bit count units to receive the failure bit count current from one of the plurality of failure bit count units; and a comparator, having a first input end that receives a reference current, and a second input end that receives a measurement current that is obtained by adding the failure measurement current and the redundancy current, and an output end that outputs a judge signal to indicate a number of failure bits for each sector by comparing the reference current and the failure measurement current.

In one embodiment, the failure bit count circuit for memory array may further comprises a first current-voltage converter that converts the reference current into a reference voltage; and a second current-voltage converter that converts the measurement current into a measurement voltage.

In one embodiment, the failure bit count circuit for memory array may further comprises: a voltage divider that divides the reference voltage into N divided reference voltages, in which N is equal to an allowable number of failure bits for each of the plurality of sectors.

In one embodiment, the comparator may further comprise N comparator modules. Each of the N comparator modules has a first input end that receives a corresponding divided reference voltage among the N divided reference voltages, and each of the N comparator modules has a second input end that receives measurement voltage. In addition, outputs of the N comparator modules provide the judge signal.

In one embodiment, the switch may comprise a plurality of transistors having the same number as the plurality of sectors. The plurality of transistors is respectively and correspondingly connected to the plurality of sectors, and the plurality of transistors is parallelly connected and operated in a manner that one of the plurality of transistors is turned on at one time.

In one embodiment, each of plurality of failure bit count units comprises a current mirror and a latch coupled to the current mirror, and a result of a program verify to the sector is latched in the latch so as to activate the current mirror in a case that the program verify is failed. In one embodiment, the redundancy failure bit count unit has the same configuration as each of the plurality of failure bit count units.

In one embodiment, the failure bit count circuit for memory array may further comprises at least one reference current generator for generating the reference current. In one embodiment, the at least one reference current generator is provided in a well pickup region in a page buffer of the memory array.

In one embodiment, the plurality of failure bit count units and the redundancy failure bit count unit are provided in a page buffer of the memory array. In one embodiment, the comparator and the switch are provided in a peripheral region of the memory array.

In one embodiment, the judge signal is provided by using a thermometer code or a binary code.

According to another embodiment of the disclosure, a method of failure bit count circuit for memory array is provided. The memory array comprises a plurality of pages and each of the pages comprises a plurality of sectors and a redundancy column, each of the plurality of sectors is provided with a failure bit count unit and the redundancy column is provided with a redundancy failure bit count unit. The method for each sector comprises: providing a failure bit count current by the failure bit count unit; providing a redundancy current by redundancy failure bit count unit; generating a failure measure current by adding the failure bit count current and the redundancy current; and comparing the failure measure current with a reference current to provides a judge signal to indicate a number of failure bits for each sector.

In one embodiment, the method may further comprise: converting the failure measure current to a failure measure voltage; converting the reference current to a reference voltage; and comparing the failure measure voltage with the reference voltage to provides the judge signal.

In one embodiment, the judge signal is provided by using a thermometer code or a binary code.

According to the disclosure, the failure bit count units are provided for each sector of a page, and the redundancy column is also provided with the same failure bit count unit. Furthermore, the addition of the failure bit count current and the redundancy current is used to compared with the reference, so that the number of the failure bits in each sectors can be effectively determined.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
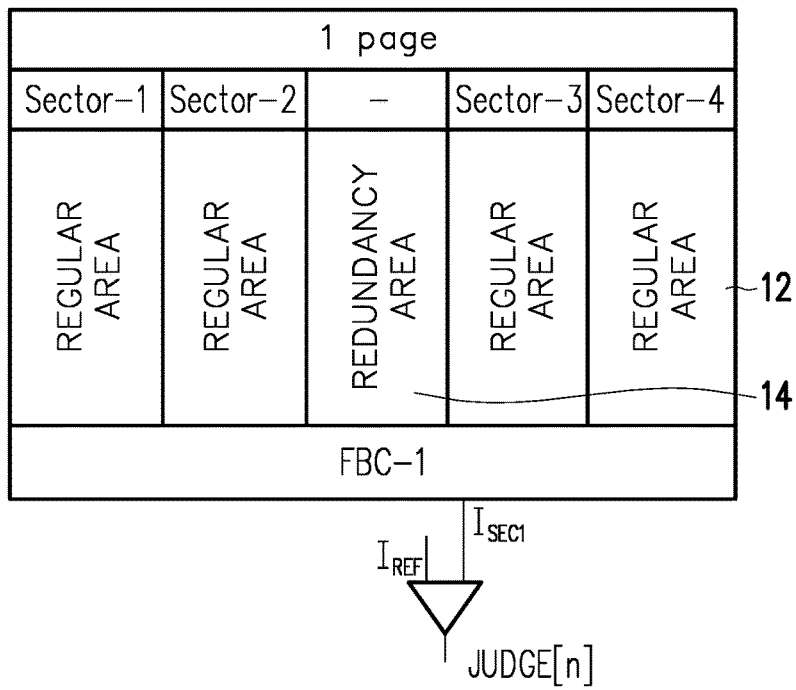
FIG. 1 illustrates a configuration for repairing the memory cells and failure bit count mechanism in the memory device.
Figure 2:
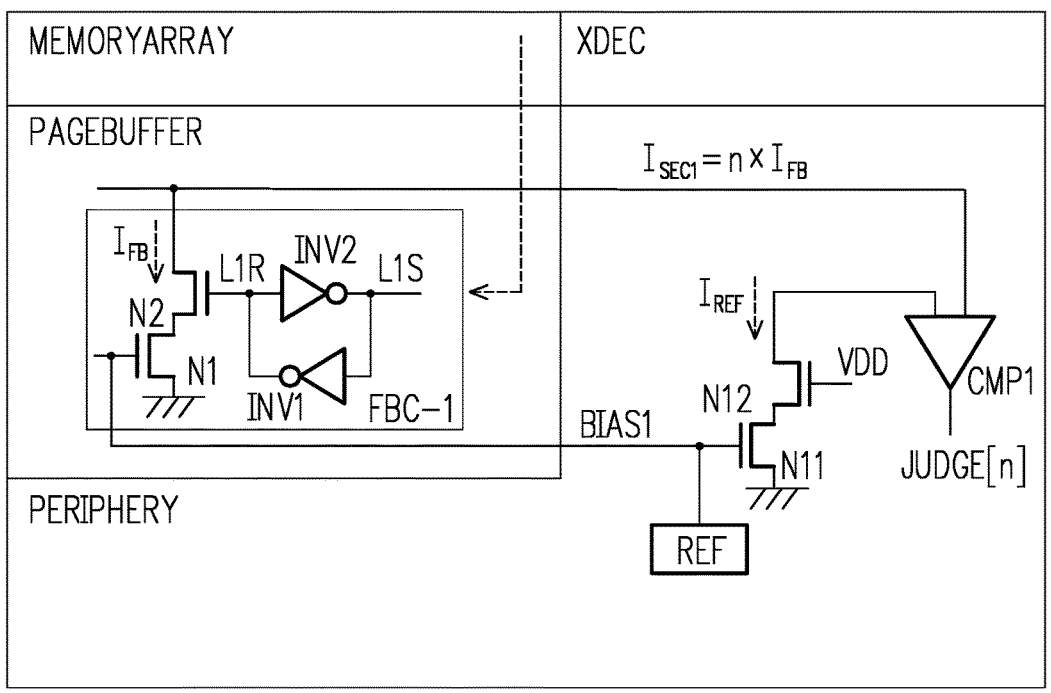
FIG. 2 illustrates a failure bit count circuit for a memory device according to the related art.
Figure 3:
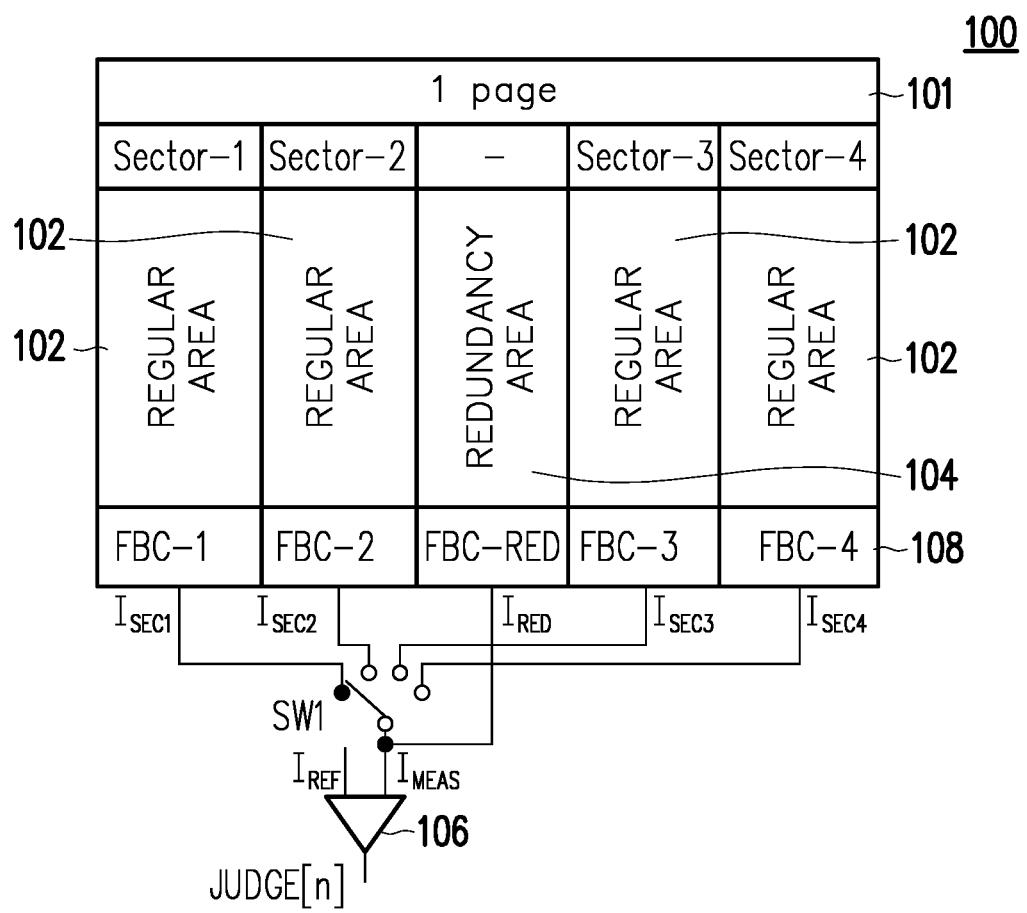
FIG. 3 illustrates a failure bit count circuit for memory array according to one embodiment of the disclosure

FIG. 3 illustrates a failure bit count circuit for memory array according to one embodiment of the disclosure. In this embodiment, a flash memory can be used as an example. The flash memory comprises a memory array provided multiple banks and each bank has multiple pages that further includes several sectors. As shown in FIG. 2, one page 101 of the memory array 100 is illustrated and each page comprises a plurality of regular areas 102 (such as sector-1, sector-2, sector-3, sector-4) and a redundancy area (or redundancy column(s)) 104. The redundancy area 104 is used to repair the memory cells in any one of regular areas 102.

In addition, a plurality of failure bit count units FBC-1, FBC-2, FBC-3 and FBC-4 is provided in the page buffer 108, and each of the failure bit count units FBC-1, FBC-2, FBC-3, and FBC-4 is respectively coupled to each of the sector-1, sector-2, sector-3, sector-4 (the regular area 102). For example, when there are failure bits existed in sector-1, i.e., when the program verify is failed, a low level signal L is issued to the failure bit count unit FBC-1, and the failure bit count unit FBC-1 outputs a failure bit count current $I_{SEC1}$ that is n times the failure bit current $I_{FB}$. Namely, the failure bit count current $I_{SEC1}$ is equal to n times the failure bit current $I_{FB}$, where n is the number of the failure bits.

In addition, a redundancy failure bit count unit FBC-RED is also provided in the page buffer 108 for the redundancy area 104. The failure bit count unit FBC-RED has the same structure as the failure bit count units FBC-1, FBC-2, FBC-3, and FBC-4. The redundancy failure bit count unit FBC-RED may output a redundancy current RED.

In addition, a switch SW1 is further provided and has a first end and a second end that is capable of being switched to couple to the outputs of the failure bit count units FBC-1, FBC-2, FBC-3, and FBC-4. Namely, the switch SW1 may be operated to switch to connect to each of the failure bit count units FBC-1, FBC-2, FBC-3, and FBC-4 at every predetermined time period, so that the failure bit count currents $I_{SEC1} \sim I_{SEC4}$ of the failure bit count units FBC-1, FBC-2, FBC-3, and FBC-4 can be respectively read out.

In addition, a comparator 106 is also provided and has a first input end that receives a reference current $I_{REF}$ and a second input end that receives a failure measurement current $I_{MEAS}$, and output a judge signal JUDGE[n] that indicates the number of failure bits for each sector by comparing the reference current $I_{REF}$ and the failure measurement current $I_{MEAS}$. failure measurement current $I_{MEAS}$ is obtained by adding the failure bit count current $I_{SEC1}$ ($I_{SEC2}$, $I_{SEC3}$, or $I_{SEC4}$) and the redundancy current $I_{RED}$.

For example, when the switch SW1 is switched to connected to the failure bit count unit FBC-1, the failure bit count unit FBC-1 will provide the failure bit count currents $I_{SEC1}$ to the second input end of the comparator 106. Also, the redundancy current $I_{RED}$ is also provided to the second input end of the comparator 106. As a result, the second input end of the comparator 106 receives the failure measurement current $I_{MEAS1}$ that is an addition of the failure bit count currents $I_{SEC1}$ and redundancy current $I_{RED}$. Then, the comparator 106 compares the failure measurement current $I_{MEAS1}$ and the reference current $I_{REF}$ that is provided to the first input end of the comparator 106, and the judge signal JUDGE[n] for the regular area 102 of the sector-1 is output. Therefore, the number of the failure bits of the sector-1 can be determined.

Then, the failure bit counting is sequentially performed for the other sector-2, sector-3, and sector-4.

Figure 4:
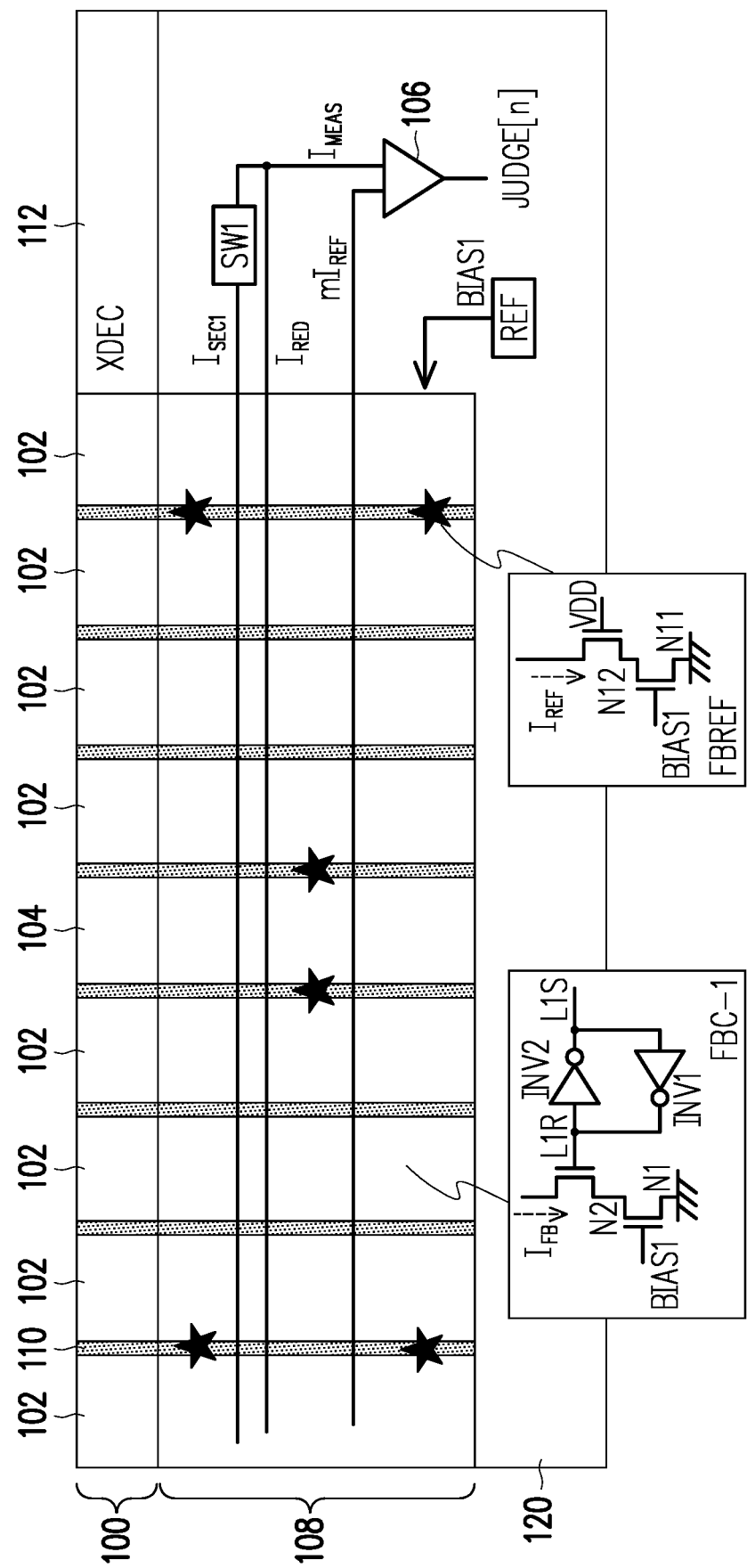
FIG. 4 illustrates a schematic layout for the failure bit count circuit for memory array.

FIG. 4 illustrates a schematic layout for the failure bit count circuit for memory array. As shown in FIG. 4, for example, the memory may comprise a memory array 100, a page buffer 108, an X decoder 112, and a peripheral region 120. Only required portions are illustrated and the memory may further comprise other components which can be added for those skilled in this art. The memory can further provide with plural well pickup regions, i.e., well-taps 110 in the memory array 100 and the page buffer 108, which are arranged along the vertical direction or the column direction of the memory array 100. The memory array 100 may comprises the multiple regular areas 102 (sectors) and the redundancy area 104.

As shown in FIG. 4, the failure bit count units FBC-1, FBC-2, FBC-3, and FBC-4 shown in FIG. 3 are arranged in the page buffer 108 for each regular region (sector) 102. In FIG. 4, only the failure bit count unit FBC-1 is illustrated as an example, and the other failure bit count units FBC-2, FBC-3 and FBC-4 are arranged in the same manner. It should be noted that only one output $I_{SEC1[n]}$ of the failure bit count unit FBC-1 is depicted for simplification.

As shown in FIG. 4, the failure bit count unit FBC-1 comprises NMOS transistors N1, N2 and inverters INV1, INV2. The gate of the NMOS transistor N2 is coupled to a node L1R and the drain of the NMOS transistor N2 is connected to the source of the NMOS transistor N1. The drain of the NMOS transistor N1 is grounded and the gate of the NMOS transistor N11 is biased by a bias voltage BIAS1. The source of the NMOS transistor receives the failure bit current $I_{FB}$ from the target sector (in this example, sector-1).

In addition, the reference current IREF provided to the comparator 106 is configured by current mirror. The reference current generators FBREF are relocated into the well-taps 110 in the region of page buffer 108. The locations of the reference current generators FBREF are labeled by "star" marks. In addition, the number of reference current generators FBREF and their locations are considered by a basic device mismatching improvement. The more the reference current generators FBREF, the less the device mismatching. In this example, m reference current generators FBREF are provided.

As an example, the reference current generator FBREF comprises NMOS transistors N11 and N12. The gate of the NMOS transistor N12 is coupled to a voltage source VDD and the drain of the NMOS transistor N12 is connected to the source of the NMOS transistor N11. The drain of the NMOS transistor N11 is grounded and the gate of the NMOS transistor N11 is biased by a bias voltage BIAS1. The NMOS transistors N11 and N12 have the same dense pattern situation as the NMOS transistor N1 and N2 of the failure bit count unit FBC-1 (or FBC-2~FBC-4). In addition, the size of NMOS transistors N11-N12 in the reference current generator FBREF and the size of NMOS transistors N1-N2 in the failure bit count unit FBC are the same.

In addition, the switch SW1, the comparator 106 of the failure bit count circuit shown in FIG. 3 are arranged in the peripheral region 120. Also, the bias voltage BIAS1 provided to the reference current generator FBREF may also arranged in the peripheral region 120.

Figure 5:
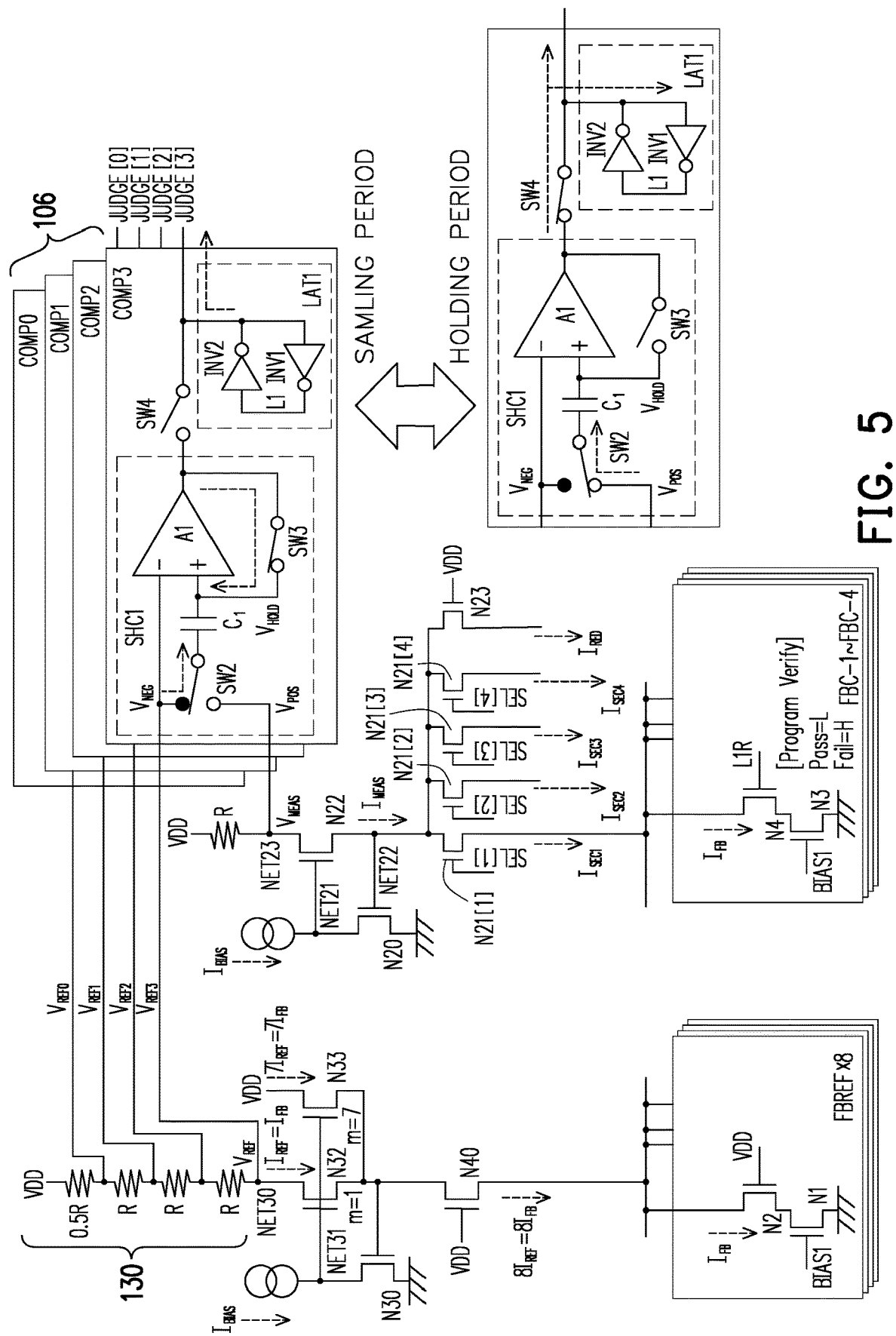
FIG. 5 illustrates an exemplary detail configuration of the failure bit count circuit according to one embodiment of the disclosure.

FIG. 5 illustrates an exemplary detail configuration of the failure bit count circuit according to one embodiment of the disclosure, and the detail operations will be described with reference to FIG. 5. In this exemplary embodiment, four sectors are provided for each page of the memory array, and eight reference current generators FBREF are provided in the well-taps 110 in the page buffer 108 (see FIG. 4).

Referring to FIG. 5, four comparator modules COM0~COM3 are further provided to server as the comparator 106 shown in FIG. 3. According to the embodiment, if n failure bits in a sector is allowed, n comparator modules may be provided. In this embodiment, 4 failure bits in a sector is allowed is used as an example. When there are no failure bits in a sector, then the outputs JUDGE[n] of the comparator module COM0~3 are all at the low level L. Table 1 illustrates a combination of the outputs JUDGE[n] of the comparator module COM0~3. Referring to Table 1, when there are 2 failure bits in a sector, then the outputs JUDGE[0] and JUDGE[1] of the comparator module COM0~1 are at the low level H, while the outputs JUDGE [2] and JUDGE[3] of the comparator module COM2-3 are at the low level L. Therefore, the number of failure bits for each sector can be determined based on the outputs JUDGE[n] of the comparator module COM0~3. In the result, the judge signal JUDGE[3:0] presents the thermometer code and may recognizes 3 failure bits. In a case of 4 failure bits or more, all JUDGE[3:0] of the judge signal JUDGE[n] becomes the high level H. In addition, a binary code can be also used for the judge signal JUDGE[n].

TABLE 1

| failure bit | JUDGE[n] | | | | $I_{MEAS}$ |
| --- | --- | --- | --- | --- | --- |
| | 0 | 1 | 2 | 3 | |
| 0 | L | L | L | L | 0 |
| 1 | H | L | L | L | $I_{FB}$ |
| 2 | H | H | L | L | $2I_{FB}$ |
| 3 | H | H | H | L | $3I_{FB}$ |
| ≥4 | H | H | H | H | $4I_{FB}$ |

In addition, as shown in FIG. 5, although eight reference current generators FBREF are provided to generate a reference current of $8I_{REF}$, but only one reference current generator FBREF is required. Therefore, a pair of source coupled NMOS transistors N32 and N33 are provided to separate the reference current of $8 \cdot I_{REF}$ into the reference current $I_{REF}$ that flows through the NMOS transistor N12 and the reference current $7I_{REF}$ that flows through the NMOS transistor N13. Each reference current generator FBREF is a current mirror consisting of NMOS transistors N1, N2 as shown, and the eight reference current generators FBREF have the same configuration and size.

In FIG. 5, a first current-voltage (IV) convertor having a negative feedback configuration with unity gain is further provided, and includes NMOS transistors N30, N32, N33 and a current source $I_{BIAS}$. The node NET30 is forced to the threshold voltage VTH of the NMOS transistor N30 by the negative feedback. This first I-V convertor may convert the reference current $I_{REF}$ into a reference voltage REF at the node NET30.

In addition, a voltage divider 130 having resistors that are serially connected is further included. In this example, voltage divider 130 includes four resistors 0.5R, R, R, R to divide the reference voltage $V_{REF}$ into four reference voltages (divided reference voltages) $V_{REF0}$~$V_{REF3}$, and the reference voltages $V_{REF0}$~$V_{REF3}$ are respectively and correspondingly provided to one input end of the comparator module COM0-3. In addition, the number of the divided reference voltages is corresponding to the allowable failure bit number. In this example, each sector can allow 4 failure bits, and the reference voltage VREF is divided into four reference voltages $V_{REF0}$~$V_{REF3}$.

For example, the reference voltage $V_{REF0}$ is provided to one input end of the comparator A1 of the comparator module COM0, the reference voltage $V_{REF1}$ is provided to one input end of the comparator A1 of the comparator module COM1, the reference voltage $V_{REF2}$ is provided to one input end of the comparator A1 of the comparator module COM2 and the reference voltage $V_{REF3}$ is provided to one input end of the comparator A1 of the comparator module COM3.

In addition, four failure bit count units FBC-1~FBC-4 are provided as an example, and each failure bit count unit FBC includes NMOS transistors N3, N4, like the failure bit count units FBC-1~FBC-4 shown in FIG. 4 but omitting the latch for simplification. In FIG. 5, the failure bit count units FBC-1~FBC-4 provides the failure bit count currents $I_{SEC1}$~$I_{SEC4}$ respectively.

Moreover, in order to keep same dense pattern between reference current generators FBREF and the failure bit count units FBC-1~FBC-4, the size of the NMOS transistors N1, N2 and the size of the NMOS transistors N3, N4 are the same. As a result, the reference current $I_{REF}$ is equal to the failure bit current $I_{FB}$.

The NMOS transistors N21[1]~N21[4] serves as the switch SW1 shown in FIG. 3. The NMOS transistors N21

[1]~N21[4] are respectively and corresponding connected to the failure bit count units FBC-1~FBC-4. For example, the failure bit count unit FBC-1 is connected to the NMOS transistor N21[1] and the failure bit count unit FBC-3 is connected to the NMOS transistor N21[3]. The NMOS transistors N21[1]/N21[4] are respectively controlled by control signal SEC[1]~SEC[3] to turn on or off. At each time only one of the NMOS transistors N21[1]~N21[4] is turned on and the other are turned off. The NMOS transistors N21[1]~N21[4] function like an OR operation.

A NMOS transistor N23 is further provided to connect to the redundancy failure bit count unit FBC-RED that provides the redundancy current IRE D as shown in FIG. 3. The gate of the NMOS transistor N23 is connected to the voltage source VDD to ensure that the NMOS transistor N23 may be always turned on.

The NMOS transistors N21[1]~N21[4] and the NMOS transistor N23 are operated to provide the failure measurement current $I_{MEAS}$, which is an addition of the redundancy current $I_{RED}$ and one of the failure bit count currents $I_{SEC1}$~$I_{SEC4}$. This failure measurement current $I_{MEAS}$ is then provided to the comparator modules COM0~3.

A second current-voltage (IV) convertor having a negative feedback configuration with unity gain is further provided, and includes NMOS transistors N20, N22 and a current source $I_{BIAS}$. The node NET22 is forced to the threshold voltage $V_{TH}$ of NMOS transistor N20 by the negative feedback. This second I-V convertor may convert the failure measurement current $I_{MEAS}$ into a failure measurement voltage $V_{MEAS}$ at the node NET23. Then, the failure measurement voltage $V_{MEAS}$ is provided to another input end of the comparator modules COM0~3.

Then, using the sector-1 as an example, the NMOS transistor N21[1] is turned on and the NMOS transistor N21[1] is turned off. As a result, the failure measurement current $I_{MEAS}$ becomes the addition of the failure bit count currents $I_{SEC1}$~and the redundancy current $I_{RED}$ and is converted into the failure measurement $V_{MEAS}$ that is provided to the another input ends of comparator modules COM0-3. In addition, the reference voltages $V_{REF0}$~$V_{REF3}$ are respectively and correspondingly provided to the one input end of the comparator modules COM0~3, such as the reference voltages $V_{REF0}$ for the comparator module COM0, the reference voltages $V_{REF2}$ for the comparator module COM2, etc. Then, the comparator module COM0 compares the failure measurement $V_{MEAS}$ with the reference voltages $V_{REF0}$, the comparator module COM1 compares the failure measurement $V_{MEAS}$ with the reference voltages $V_{REF1}$, the comparator module COM2 compares the failure measurement voltage $V_{MEAS}$ with the reference voltages $V_{REF2}$, and the comparator module COM3 compares the failure measurement voltage $V_{MEAS}$ with the reference voltages $V_{REF3}$ Like listed in Table 1, for example, if there are 2 failure bits in the sector-1, then the failure measurement voltage $V_{MEAS}$ becomes $2I_{FB}$. As a result, the output JUDGE[0] and JUDGE[1] of the comparator modules COM0, COM1 are the high level H, while the output JUDGE[2] and JUDGE[3] of the comparator modules COM2, COM3 are the low level L. Thus, the judge signal JUDGE[n] output from the comparator 106 becomes "1100", if the low level L is defined as "0" and the high level H is defined as "1". Therefore, the number of the failure bits of the sector-1 can be determined.

Next, the operations of the comparator modules COM0~COM3 are described in detail. Each of the comparator modules COM0~COM3 has the same configuration. In this embodiment, sample-hold comparators are used as an example for the comparator modules COM0~COM3. As shown in FIG. 5, each of the comparator modules COM0~COM3 comprises a sample-hold comparator SHC1 and a latch LAT1. The sample-hold comparator SHC1 includes an operational amplifier A1, a capacitor C1, switches SW1, SW3 as shown. The latch LAT1 includes inverters INV1, INV2 connected as shown in FIG. 5. A switch SW4 is further provided that is turned on during the holding period so that the latch LAT1 may latch the output of the operational amplifier A1.

For each sector, after the program verify is performed, the result of the program verify is latched at the node L1R by the latch (including inverters INV1 INV2, as shown in FIG. 4). At the beginning, the comparator modules COM0~COM3 are in the sampling period. Using the sector-1 as an example, one of the NMOS transistors N21[1]~N21[4] is turned on, i.e., the NMOS transistor N21[1] is turned on by the control signal SEL[1], the failure bit count current $I_{SEC1}$ and the redundancy current $I_{RED}$ are added to generate the failure measurement current $I_{MEAS}$. At the same time, the switch SW2 is switched to the negative-end voltage $V_{NEG}$ (i.e., $V_{REF}$) and the switch SW3 is turned on and the switch SW4 is turned off. As a result, the operational amplifier A1 becomes a unity gain buffer and the holding voltage $V_{HOLD}$ is equal to output voltage of the operational amplifier A1. In addition, since the output voltage of the operational amplifier A1 is the negative-end voltage $V_{NEG}$, both ends of the capacitor C1 are the same potential.

Then, the comparator modules COM0~COM3 enter the holding period. The switch SW2 is thus switched to the positive-end voltage $V_{POS}$ (i.e., $V_{MEAS}$), the switch SW3 is turned off and the switch SW4 is turned on. When the switch SW2 is switched to the voltage $V_{POS}$, the potential of capacitor C1 at the switch SW2 side changes from the negative-end voltage $V_{NEG}$ to the positive-end voltage $V_{POS}$. In addition, holding voltage $V_{HOLD}$ follows the potential of C1 at the switch SW2 side. Thus, the operational amplifier A1 functions a comparator to compare the failure measurement voltage $V_{MEAS}$ ($V_{POS}$) and the reference voltage $V_{REF}$ ($V_{NEG}$) and the output of the operational amplifier A1 is latched by the latch LAT1. Therefore, the comparator modules COM0~COM3 output the judge signal JUDGE [3:0].

Figure 6:
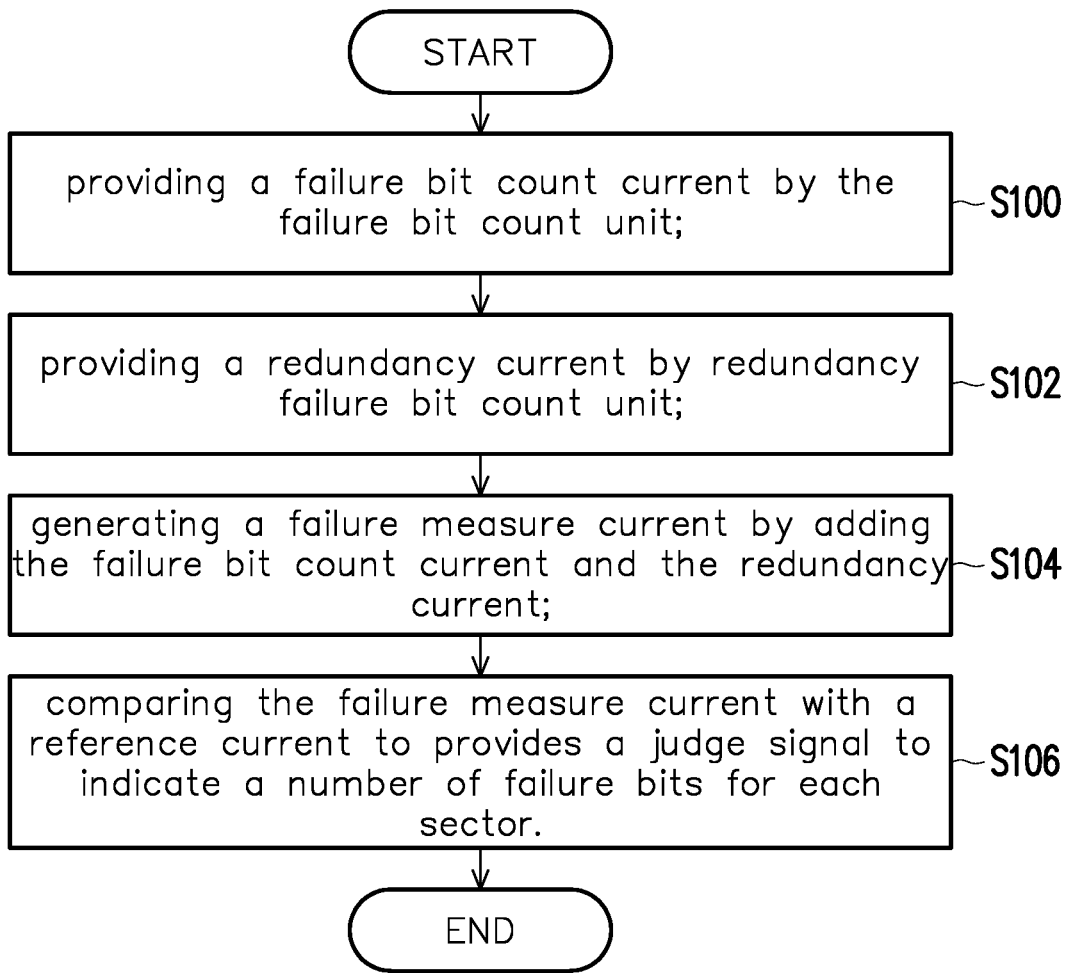
FIG. 6 illustrates a flow chart according to a method of failure bit count for memory based on the embodiment of the disclosure.

FIG. 6 illustrates a flow chart according to a method of failure bit count for memory based on the embodiment of the disclosure. This flow chart is performed for each of the sectors in one page of the memory array. For simplification, in the following description, the sector-1 in FIG. 3 is used as an example, and the number of failure bits for other sectors (sector-2~sector4) can be determined in the same way.

As shown in FIGS. 6 and 3, in step S100, a failure bit count current $I_{SEC1}$ is provided by the failure bit count unit FBC-1. For example, when the program verify is performed and failed for a sector-1, the failure bit count unit FBC-1 will latch the result of the program verify so as to activate the current mirror of the failure bit count unit FBC-1 to generate the failure bit count current $I_{SEC1}$ that is n times of the failure bit current $I_{FB}$, where n is the number of the failure bits.

In step S102, a redundancy current $I_{RED}$ is also provided by redundancy failure bit count unit FBC-RED as shown in FIG. 3. As described above, the redundancy failure bit count unit FBC-RED constantly provide the redundancy current $I_{RED}$ to the second input end of the comparator 106 as shown in FIG. 3.

Then, in step S104, a failure measure current $I_{MEAS}$ is generated by adding the failure bit count current $I_{SEC1}$ and the redundancy current $I_{RED}$. The failure bit count current $I_{SEC1}$ is also provided to the same second input end of the comparator 106, so that the addition (the failure measure current $I_{MEAS}$) of the failure bit count current $I_{SEC1}$ and the redundancy current $I_{RED}$ can be provided to the comparator 106.

In step S106, the failure measure current $I_{MEAS}$ is compared with a reference current IREF to provides a judge signal JUDGE[n] to indicate a number of failure bits for the sector. judge signal JUDGE[n] can be presented by a thermometer code or a binary code. Table 1 illustrates an example. By using the judge signal JUDGE[n], the number of the failure bits can be determined.

In summary, according to the disclosure, the failure bit count units are provided for each sector of a page, and the redundancy column is also provided with the same failure bit count unit. Furthermore, the addition of the failure bit count current and the redundancy current is used to compared with the reference, so that the number of the failure bits in each sectors can be effectively determined.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A failure bit count circuit for memory array, wherein the memory array comprises a plurality of pages and each of the pages comprises a plurality of sectors and a redundancy column, the failure bit count circuit for each of the pages comprising:
    a plurality of failure bit count units, in which each of the plurality of failure bit count units is respectively coupled to each of the plurality of sectors for providing a failure bit count current;
    a redundancy failure bit count unit which is coupled to redundancy column and provides a redundancy current;
    a switch which has a first end and a second end that is capable of being switched to couple to one of outputs of the plurality of failure bit count units to receive the failure bit count current from one of the plurality of failure bit count units; and
    a comparator, having a first input end that receives a reference current, and a second input end that receives a failure measurement current that is obtained by adding the failure bit count current and the redundancy current, and an output end that outputs a judge signal to indicate a number of failure bits for each sector by comparing the reference current and the failure measurement current.

2. The failure bit count circuit for memory array according to claim 1, further comprising:
    a first current-voltage converter that converts the reference current into a reference voltage; and
    a second current-voltage converter that converts the measurement current into a measurement voltage.

3. The failure bit count circuit for memory array according to claim 2, further comprising: a voltage divider that divides the reference voltage into N divided reference voltages, in which N is equal to an allowable number of failure bits for each of the plurality of sectors.

4. The failure bit count circuit for memory array according to claim 3, wherein the comparator further comprises N comparator modules,
    each of the N comparator modules has a first input end that receives a corresponding divided reference voltage among the N divided reference voltages,
    each of the N comparator modules has a second input end that receives measurement voltage, and
    outputs of the N comparator modules provide the judge signal.

5. The failure bit count circuit for memory array according to claim 1, wherein the switch comprises a plurality of transistors having the same number as the plurality of sectors,
    the plurality of transistors is respectively and correspondingly connected to the plurality of sectors, and
    the plurality of transistors is connected in parallel and operated in a manner that one of the plurality of transistors is turned on one at a time.

6. The failure bit count circuit for memory array according to claim 1, wherein each of plurality of failure bit count units comprises a current mirror and a latch coupled to the current mirror, and a result of a program verify to the sector is latched in the latch so as to activate the current mirror in a case that the program verify has failed.

7. The failure bit count circuit for memory array according to claim 1, wherein the redundancy failure bit count unit has the same configuration as each of the plurality of failure bit count units.

8. The failure bit count circuit for memory array according to claim 1, further comprising at least one reference current generator for generating the reference current.

9. The failure bit count circuit for memory array according to claim 8, wherein the at least one reference current generator is provided in a well pickup region in a page buffer of the memory array.

10. The failure bit count circuit for memory array according to claim 1, wherein the plurality of failure bit count units and the redundancy failure bit count unit are provided in a page buffer of the memory array.

11. The failure bit count circuit for memory array according to claim 1, wherein the comparator and the switch are provided in a peripheral region of the memory array.

12. The failure bit count circuit for memory array according to claim 1, wherein the judge signal is provided by using a thermometer code or a binary code.

13. A method of failure bit count circuit for memory array, wherein the memory array comprises a plurality of pages and each of the pages comprises a plurality of sectors and a redundancy column, each of the plurality of sectors being provided with a failure bit count unit and the redundancy column being provided with a redundancy failure bit count unit, the method for each sector comprising:
    providing a failure bit count current by the failure bit count unit;
    providing a redundancy current by redundancy failure bit count unit;
    switching between outputs of the plurality of failure bit count units to receive the failure bit count current from the plurality of failure bit count units, respectively;
    generating a failure measure current by adding the failure bit count current and the redundancy current;
    receiving a reference current; and
    comparing the failure measure current with the reference current to provide a judge signal to indicate a number of failure bits for each sector.

14. The method according to claim 13, further comprising:
    converting the failure measure current to a failure measure voltage;
    converting the reference current to a reference voltage; and comparing the failure measure voltage with the reference voltage to provide the judge signal.

15. The method according to claim 13, wherein the judge signal is provided by using a thermometer code or a binary code.

* * * * *